(12) United States Patent
Adusumilli et al.

(10) Patent No.: US 11,127,816 B2
(45) Date of Patent: Sep. 21, 2021

(54) HETEROJUNCTION BIPOLAR TRANSISTORS WITH ONE OR MORE SEALED AIRGAP

(71) Applicant: GLOBALFOUNDRIES U.S. INC., Santa Clara, CA (US)

(72) Inventors: Siva P. Adusumilli, South Burlington, VT (US); Rajendran Krishnasamy, Essex Junction, VT (US); Steven M. Shank, Jericho, VT (US); Vibhor Jain, Essex Junction, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/791,214

(22) Filed: Feb. 14, 2020

(65) Prior Publication Data
US 2021/0257454 A1 Aug. 19, 2021

(51) Int. Cl.
*H01L 29/08* (2006.01)
*H01L 29/49* (2006.01)
*H01L 29/16* (2006.01)
*H01L 29/737* (2006.01)
*H01L 29/66* (2006.01)

(52) U.S. Cl.
CPC ...... *H01L 29/0821* (2013.01); *H01L 29/0804* (2013.01); *H01L 29/16* (2013.01); *H01L 29/4991* (2013.01); *H01L 29/66242* (2013.01); *H01L 29/7375* (2013.01); *H01L 29/7378* (2013.01)

(58) Field of Classification Search
CPC . H01L 29/0821; H01L 29/16; H01L 29/7378; H01L 29/66242; H01L 29/0804; H01L 29/7375; H01L 29/4991
See application file for complete search history.

(56) References Cited

U.S. PATENT DOCUMENTS

| | | |
|---|---|---|
| 4,710,794 A | 12/1987 | Koshino et al. |
| 4,888,300 A | 12/1989 | Burton |
| 5,427,975 A | 6/1995 | Sparks et al. |
| 5,844,299 A | 12/1998 | Merill et al. |
| 5,869,374 A | 2/1999 | Wu |
| 5,943,581 A | 8/1999 | Lu et al. |
| 5,949,144 A | 9/1999 | Delgado et al. |

(Continued)

FOREIGN PATENT DOCUMENTS

| | | |
|---|---|---|
| JP | 2009099841 | 5/2009 |
| TW | 201711190 | 3/2017 |

OTHER PUBLICATIONS

Office Action in U.S. Appl. No. 16/241,441 dated May 12, 2020, 8 pages.

(Continued)

*Primary Examiner* — Syed I Gheyas
(74) *Attorney, Agent, or Firm* — David Cain; Andrew M. Calderon; Roberts Calderon Safran & Cole, P.C.

(57) ABSTRACT

The present disclosure relates to semiconductor structures and, more particularly, to a heterojunction bipolar transistor having one or more sealed airgap and methods of manufacture. The structure includes: a subcollector region in a substrate; a collector region above the substrate; a sealed airgap formed at least partly in the collector region; a base region adjacent to the collector region; and an emitter region adjacent to the base region.

20 Claims, 7 Drawing Sheets

(56) References Cited

U.S. PATENT DOCUMENTS

| | | |
|---|---|---|
| 5,972,758 A | 10/1999 | Liang |
| 6,093,330 A | 7/2000 | Chong et al. |
| 6,093,599 A | 7/2000 | Lee et al. |
| 6,057,202 A | 9/2000 | Chen et al. |
| 6,140,197 A | 10/2000 | Chu et al. |
| 6,255,704 B1 | 7/2001 | Iwata et al. |
| 6,258,688 B1 | 7/2001 | Tsai |
| 6,274,920 B1 | 8/2001 | Park et al. |
| 6,307,247 B1 | 10/2001 | Davies |
| 6,337,499 B1 | 1/2002 | Werner |
| 6,376,291 B1 | 4/2002 | Barlocchi et al. |
| 6,518,144 B2 | 2/2003 | Nitta et al. |
| 6,518,147 B1 | 2/2003 | Villa |
| 6,551,944 B1 | 4/2003 | Fallica et al. |
| 6,570,217 B1 | 5/2003 | Sato et al. |
| 6,670,257 B1 | 12/2003 | Barlocchi et al. |
| 6,720,229 B2 | 4/2004 | Norström et al. |
| 6,833,079 B1 | 12/2004 | Giordani |
| 6,835,631 B1 | 12/2004 | Zhen et al. |
| 6,928,879 B2 | 8/2005 | Partridge et al. |
| 6,992,367 B2 | 1/2006 | Erratico et al. |
| 7,009,273 B2 | 3/2006 | Inoh et al. |
| 7,053,747 B2 | 5/2006 | Joodaki |
| 7,279,377 B2 | 10/2007 | Rueger et al. |
| 7,294,536 B2 | 11/2007 | Villa et al. |
| 7,326,625 B2 | 2/2008 | Jeong et al. |
| 7,354,786 B2 | 4/2008 | Benzel et al. |
| 7,427,803 B2 | 9/2008 | Chao et al. |
| 7,662,722 B2 | 2/2010 | Stamper et al. |
| 7,678,600 B2 | 3/2010 | Villa et al. |
| 7,906,388 B2 | 3/2011 | Sonsky |
| 8,203,137 B2 | 6/2012 | Cho et al. |
| 8,319,278 B1 | 11/2012 | Zeng et al. |
| 8,575,690 B1 | 11/2013 | Hsieh |
| 8,652,951 B2 | 2/2014 | Huang et al. |
| 8,674,472 B2 | 3/2014 | Botula et al. |
| 8,907,408 B2 | 12/2014 | Sedlmaier et al. |
| 8,927,386 B2 | 1/2015 | Wu et al. |
| 9,029,229 B2 | 5/2015 | Adkisson et al. |
| 9,048,284 B2 | 6/2015 | McPartlin et al. |
| 9,059,252 B1 | 6/2015 | Liu |
| 9,159,817 B2 | 10/2015 | Camillo-Castillo et al. |
| 9,177,866 B2 | 11/2015 | Davies |
| 9,224,858 B1 | 12/2015 | Camillo-Castillo et al. |
| 9,324,846 B1 | 4/2016 | Camillo-Castillo et al. |
| 9,349,793 B2 | 5/2016 | Jaffe et al. |
| 9,355,972 B2 | 5/2016 | Dunn et al. |
| 9,570,564 B2 | 2/2017 | Alperstein et al. |
| 9,640,538 B2 | 5/2017 | Liu et al. |
| 9,711,392 B2 | 7/2017 | Dehe et al. |
| 9,722,057 B2 | 8/2017 | Camillo-Castillo et al. |
| 9,726,547 B2 | 8/2017 | Liu et al. |
| 9,917,186 B2 | 3/2018 | Laven et al. |
| 9,922,973 B1 | 3/2018 | Shank et al. |
| 10,062,757 B2 | 8/2018 | Toia et al. |
| 10,109,490 B1 | 10/2018 | Lin et al. |
| 10,446,643 B2 | 10/2019 | Adusumilli et al. |
| 10,461,152 B2 | 10/2019 | Stamper et al. |
| 2002/0043686 A1 | 4/2002 | Bolam et al. |
| 2002/0195681 A1 | 12/2002 | Melendez et al. |
| 2003/0067014 A1 | 4/2003 | Tsuruta et al. |
| 2004/0180510 A1 | 9/2004 | Ranade et al. |
| 2004/0217434 A1 | 11/2004 | Lee et al. |
| 2004/0217443 A1 | 11/2004 | Davies |
| 2005/0176222 A1 | 8/2005 | Ogura |
| 2006/0091453 A1 | 5/2006 | Matsuda et al. |
| 2006/0138541 A1 | 6/2006 | Nakamura et al. |
| 2006/0214258 A1 | 9/2006 | Kiyotoshi |
| 2006/0228864 A1 | 10/2006 | Chen et al. |
| 2007/0181920 A1 | 8/2007 | Renna et al. |
| 2007/0238250 A1 | 10/2007 | Zhang et al. |
| 2008/0044979 A1 | 2/2008 | Wells et al. |
| 2008/0073747 A1 | 3/2008 | Chao et al. |
| 2009/0072351 A1 | 3/2009 | Meunier-Beillard et al. |
| 2009/0101997 A1 | 4/2009 | Lammel et al. |
| 2009/0127648 A1 | 5/2009 | Chen et al. |
| 2009/0191687 A1 | 7/2009 | Hong et al. |
| 2010/0035403 A1 | 2/2010 | Brown et al. |
| 2010/0059854 A1 | 3/2010 | Lin et al. |
| 2010/0109120 A1 | 5/2010 | Fucsko et al. |
| 2010/0117136 A1 | 5/2010 | Yasuda |
| 2012/0028401 A1 | 2/2012 | De Munck et al. |
| 2012/0038024 A1 | 2/2012 | Botula et al. |
| 2012/0211805 A1 | 8/2012 | Winkler et al. |
| 2012/0292700 A1 | 11/2012 | Khakifirooz et al. |
| 2013/0043490 A1 | 2/2013 | Sorada |
| 2013/0320459 A1 | 12/2013 | Shue et al. |
| 2014/0042595 A1 | 2/2014 | Schulze et al. |
| 2014/0097402 A1 | 4/2014 | Wang et al. |
| 2014/0151852 A1* | 6/2014 | Adkisson ............ H01L 29/1004 |
| | | 257/565 |
| 2014/0252481 A1 | 9/2014 | Flachowsky et al. |
| 2014/0353725 A1 | 12/2014 | Adkisson |
| 2015/0179755 A1 | 6/2015 | Rooyackers et al. |
| 2015/0179791 A1 | 6/2015 | Kudou |
| 2015/0194416 A1 | 7/2015 | Cheng |
| 2015/0318665 A1 | 11/2015 | Liang |
| 2015/0348825 A1 | 12/2015 | Hebert |
| 2016/0372592 A1 | 12/2016 | Cho |
| 2017/0110574 A1 | 4/2017 | LaVen et al. |
| 2017/0117224 A1 | 4/2017 | Adusumilli et al. |
| 2017/0170056 A1 | 6/2017 | Jaffe et al. |
| 2018/0083098 A1 | 3/2018 | Goktepeli |
| 2019/0013382 A1 | 1/2019 | Stamper et al. |

OTHER PUBLICATIONS

Office Action in U.S. Appl. No. 16/575,675 dated Jun. 30, 2020, 11 pages.
Notice of Allowance in U.S. Appl. No. 15/703,220 dated Jun. 15, 2020, 8 pages.
DE Office Action in DE Application No. 102018222690.3 dated May 28, 2020, 9 pages.
Notice of Allowance in U.S. Appl. No. 16/241,441 dated Nov. 9, 2020, 8 pages.
Response to Office Action in U.S. Appl. No. 16/538,062, filed Jan. 4, 2021, 9 pages.
Response to Office Action in U.S. Appl. No. 16/206,375, filed Jan. 15, 2021, 13 pages.
Hashimoto et al., "A Study on Suppressing Crosstalk Through a Thick SOI Substrate and Deep Trench Isolation", IEEE Journal of Electronic Devices Society, Jul. 2013, vol. 1, No. 7, 7 pages.
Ohguro et al., "High performance digital-analog mixed device on a Si substrate with resistivity beyond 1 kΩ cm", IEEE, Dec. 10-13, 2000, 4 pages.
Taiwanese Office Action in TW Application No. 106132441 dated Jul. 16, 2018, 10 pages.
Taiwanese Office Action in U.S. Application No. 107112403 dated Oct. 18, 2018, 9 pages.
Taiwanese Office Action and Search Report in TW Application No. 106132441 dated Dec. 7, 2018, 14 pages.
Taiwanese Notice of Allowance in TW Application No. 107112403 dated Mar. 27, 2019, 4 pages.
Taiwanese Office Action in TW Application No. 106132441 dated Jun. 4, 2019, 10 pages.
Office Action in U.S. Appl. No. 15/703,220 dated Oct. 18, 2019, 18 pages.
Response to Office Action in U.S. Appl. No. 15/703,220 dated Jan. 17, 2020, 12 pages.
Final Office Action in U.S. Appl. No. 15/703,220 dated Mar. 16, 2020, 21 pages.
Response to Final Office Action in U.S. Appl. No. 15/703,220 dated Apr. 20, 2020, 16 pages.
Taiwanese Office Action and Search Report in related TW Application No. 106132441 dated Mar. 3, 2020, 10 pages.
Response to Final Office Action in U.S. Appl. No. 15/703,220, filed Apr. 25, 2019, 13 pages.
Second Response to Final Office Action in U.S. Appl. No. 15/703,220, filed Jun. 5, 2019, 13 pages.

(56) References Cited

OTHER PUBLICATIONS

Notice of Allowance in U.S. Appl. No. 15/876,727 dated Jun. 12, 2019, 9 pages.
Notice of Allowance in U.S. Appl. No. 15/645,655 dated Jul. 19, 2019, 9 pages.
Final Office Action in U.S. Appl. No. 15/645,655 dated Jan. 31, 2019, 16 pages.
Response to Office Action in U.S. Appl. No. 15/876,727, filed Apr. 11, 2019, 7 pages.
Response to Final Office Action in U.S. Appl. No. 15/645,655, filed Mar. 20, 2019, 11 pages.
Final Office Action in U.S. Appl. No. 15/703,220 dated Mar. 19, 2019, 17 pages.
Office Action in U.S. Appl. No. 15/876,727 dated Jan. 11, 2019, 10 pages.
Response to Office Action in U.S. Appl. No. 15/645,655, filed Oct. 18, 2018, 12 pages.
Office Action in U.S. Appl. No. 15/645,655 dated Jul. 19, 2018, 17 pages.
Office Action in U.S. Appl. No. 15/703,220 dated Sep. 5, 2018, 27 pages.
Response to Office Action in U.S. Appl. No. 15/703,220, filed Dec. 5, 2018, 12 pages.
Notice of Allowance in U.S. Appl. No. 16/575,675 dated Oct. 15, 2020, 8 pages.
Response to Office Action in U.S. Appl. No. 16/575,675, filed Sep. 14, 2020, 8 pages.
Office Action in U.S. Appl. No. 16/206,375 dated Oct. 19, 2020, 12 pages.
Office Action in U.S. Appl. No. 16/538,062 dated Oct. 6, 2020, 7 pages.
Response to Office Action in U.S. Appl. No. 16/241,441, filed Aug. 12, 2020, 11 pages.
Taiwanese Notice of Allowance in TW Application No. 106132441 dated Sep. 8, 2020, 4 pages.
Taiwanese Office Action in TW Application No. 108139071 dated Aug. 21, 2020, 9 pages.
Taiwanese Notice of Allowance in TW Application No. 108139071 dated Feb. 8, 2021, 4 pages.
Final Office Action in U.S. Appl. No. 16/538,062 dated Mar. 2, 2021, 6 pages.
Notice of Allowance in U.S. Appl. No. 16/538,062 dated May 5, 2021, 4 pages.
Response to Final Office Action in U.S. Appl. No. 16/538,062, filed Apr. 12, 2021, 7 pages.
Response to Final Office Action in U.S. Appl. No. 16/206,375, filed Jun. 2, 2021,12 pages.
Final Office Action in U.S. Appl. No. 16/206,375, filed Apr. 22, 2021,10 pages.

* cited by examiner

HETEROJUNCTION BIPOLAR TRANSISTORS WITH ONE OR MORE SEALED AIRGAP

FIELD OF THE INVENTION

The present disclosure relates to semiconductor structures and, more particularly, to a heterojunction bipolar transistor having one or more sealed airgap and methods of manufacture.

BACKGROUND

A heterojunction bipolar transistor (HBT) is a type of bipolar junction transistor (BJT) which uses differing semiconductor materials for the emitter and base regions or collector and base regions, creating a heterojunction. Si/SiGe HBTs are used in power amplifier applications and require low collector-base capacitance Ccb, high cut-off frequencies fT/fMAX and high breakdown voltages (BVceo/BVcbo).

It is known that high Ccb (i.e., the collector-base capacitance) limits the ft and fmax of the HBT. In addition, traps at a corner of the shallow trench isolation region and low-doped semiconductor can result in low bias collector leakage current. Heavy doping at the corner of the shallow trench isolation region and semiconductor (collector or base region) reduces the collector leakage current, but also results in higher Ccb.

SUMMARY

In an aspect of the disclosure, a structure comprises: a subcollector region in a substrate; a collector region above the substrate; a sealed airgap formed at least partly in the collector region; a base region adjacent to the collector region; and an emitter region adjacent to the base region.

In an aspect of the disclosure, a structure comprises: a bipolar device comprising an emitter, base, collector and subcollector; shallow trench isolation regions isolating the collector; and at least one sealed airgap at least partly within the collector and at a corner of the shallow trench isolation regions.

In an aspect of the disclosure, a method comprises: forming a subcollector region in a substrate; a collector region above the substrate; forming a sealed airgap formed at least partly in the collector region; a base region adjacent to the collector region; and forming an emitter region adjacent to the base region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a heterojunction bipolar transistor having one or more sealed airgap and methods of manufacture. More specifically, in one specific embodiment, the heterojunction bipolar transistor is a SiGe heterojunction bipolar transistor with sealed airgap(s) at the interface of the collector region and a shallow trench isolation (STI). Advantageously, the transistors described herein provide improved resistor performance including lower Ccb, reduced collector leakage current and improved ft/fmax (compared to HBTs without airgaps).

In more specific embodiments, the transistor, e.g., SiGe HBT, includes a sealed airgap (or cavity) at a triple interface, i.e., the interface of the extrinsic base, corner of the shallow trench isolation and the collector region. Accordingly, the sealed airgap can be surrounded by the extrinsic base, the shallow trench isolation, and the collector region. In embodiments, the airgap is sealed with an epitaxial material, e.g., SiGe. For example, cavity structures can be in-situ epitaxially sealed (surrounded) by material of the extrinsic base, i.e., SiGe, to form the sealed airgap. In alternative embodiments, the epitaxial material of the emitter region can be used to form the seal airgap. In further embodiments, the airgap can extend vertically through part of the collector region or a combination of vertically through the intrinsic base and the collector region. In further embodiments, the airgap can be a continuous layer along the length of the emitter region or isolated holes.

It is also contemplated that the transistor can be a SiGe HBT with an epitaxially sealed airgap adjacent to the shallow trench isolation in the semiconductor material of the collector region, i.e., silicon. In this embodiment, a SiGe material of the collector region is used to seal a cavity structure, thereby forming a sealed airgap. The sealed airgap is thus surrounded by the collector region (e.g., silicon) on all sides except for the SiGe material used to seal the airgap. The sealed airgap can include a self planarizing Si on a top surface thereof.

The transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the transistors of the present disclosure have been adopted from integrated circuit (IC) technology. For example, the structures are built on wafers and are realized in films of material patterned by photolithographic processes on the top of a wafer. In particular, the fabrication of the transistors uses three basic building blocks: (i) deposition of thin films of material on a substrate, (ii) applying a patterned mask on top of the films by photolithographic imaging, and (iii) etching the films selectively to the mask.

Figure 1:
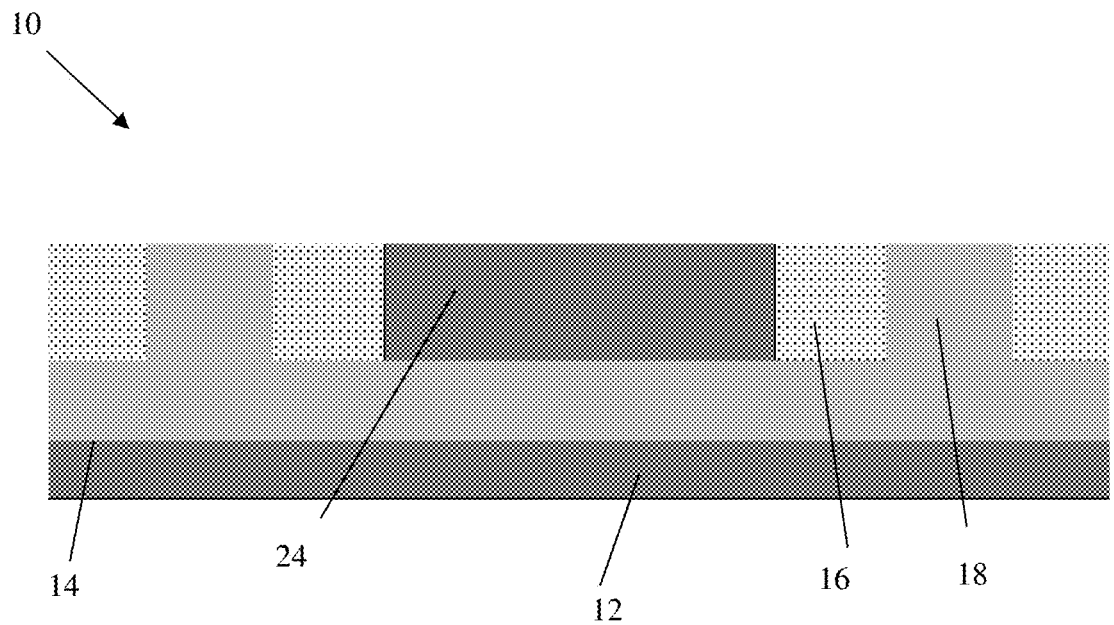
FIG. 1 shows a sub-collector implant, amongst other features, and respective fabrication processes in accordance with aspects of the present disclosure.

FIG. 1 shows a subcollector implant, amongst other features, and respective fabrication processes in accordance with aspects of the present disclosure. More specifically, the structure 10 includes a lightly doped p-type substrate 12 composed of semiconductor material and, preferably, bulk Si material. In any of the embodiments, the substrate 12 may be composed of any suitable material including, but not limited to, Si (e.g., single crystalline Si), SiGe, SiGeC, SiC, GaAs, InAs, InP, and other III/V or II/VI compound semiconductors. In further embodiments, the substrate 12 may be silicon on insulator technology (SOI) which includes an insulator layer on top of the semiconductor layer and another semiconductor layer on top of the insulator layer. The insulator is formed by any suitable process such as separation by implantation of oxygen (SIMOX), oxidation, deposition, and/or other suitable process. The other semiconductor layer on top of the insulator layer can be fabricated using wafer bonding, and/or other suitable methods.

Still referring to FIG. 1, a subcollector region 14 is formed within the substrate 12 by a doping process, e.g., ion implantation. The subcollector region 14 can be a highly doped n-type region, i.e., phosphorus or arsenic, formed by ion implantation processes or other known diffusion processes such that no further explanation is required herein.

FIG. 1 further shows shallow trench isolation regions 16 formed within the substrate 12, isolating a collector region 24. The shallow trench isolation regions 16 can be formed by conventional lithography, etching and deposition methods known to those of skill in the art. For example, a resist formed over the substrate 12 is exposed to energy (light) to form a pattern (opening). An etching process with a selective chemistry, e.g., reactive ion etching (RIE), will be used to form one or more trenches in the substrate 12 through the openings of the resist. The resist can then be removed by a conventional oxygen ashing process or other known stripants. Following the resist removal, insulator material (e.g., oxide material) can be deposited by any conventional deposition processes, e.g., chemical vapor deposition (CVD) processes. Any residual insulator material on the surface of the substrate 12 can be removed by conventional chemical mechanical polishing (CMP) processes.

Additionally, FIG. 1 shows diffusion regions 18 between the shallow trench isolation regions 16. The diffusion regions 18 can be formed by ion implantation or doping processes as described herein. The diffusion regions 18 will extend and electrically connect to the subcollector region 14. In embodiments, the diffusion regions 18 can be n-type dopants such as, e.g., As. The diffusion regions 18 can be referred to as reach through contacts.

Figure 2:
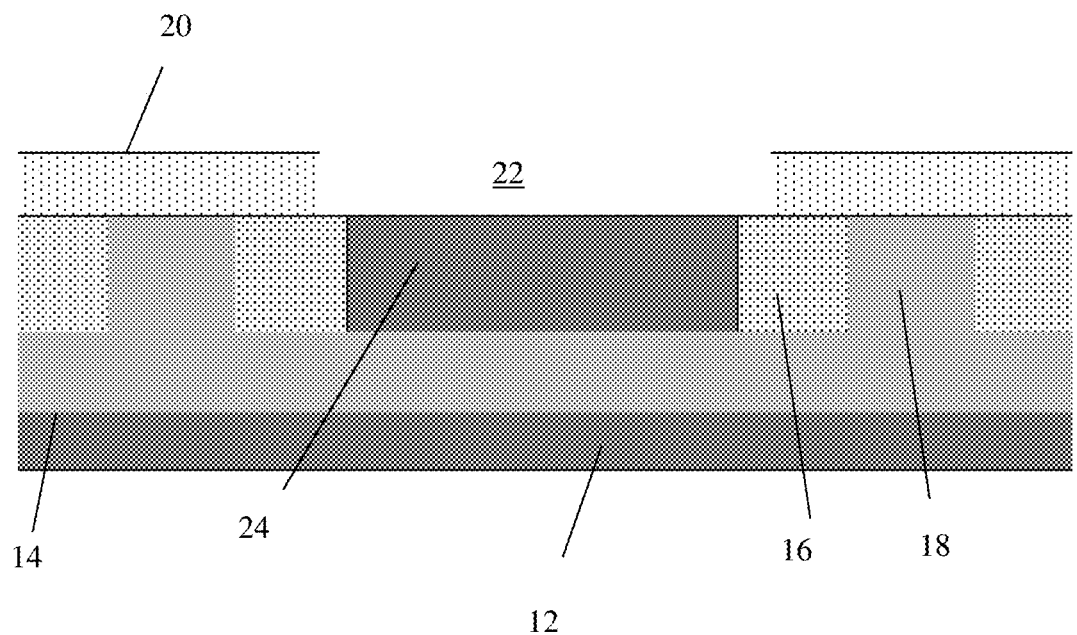
FIG. 2 shows an oxide material with an opening over the sub-collector region, amongst other features, and respective fabrication processes in accordance with aspects of the present disclosure.

In FIG. 2, a material 20 is formed over the substrate 12 and, more specifically, an oxide or polysilicon material is formed over the collector region 24, shallow trench isolation regions 16 and diffusion regions 18. In embodiments, the material 20 can be a high temperature oxide (e.g., TEOS) deposited or grown using conventional processes such that no further explanation is required for a complete understanding of the present disclosure. In alternate embodiments, the material 20 is a deposited oxide material using a conventional CVD process. In embodiments, the material 20 can have a thickness of about 100 Å to 2000 Å; although other dimensions are also contemplated herein. An opening 22 is formed in the material 20 to expose the collector region 24 (e.g., composed of Si of the substrate material 12). The opening 22 is formed by conventional lithography and etching processes as already described herein.

Figure 3:
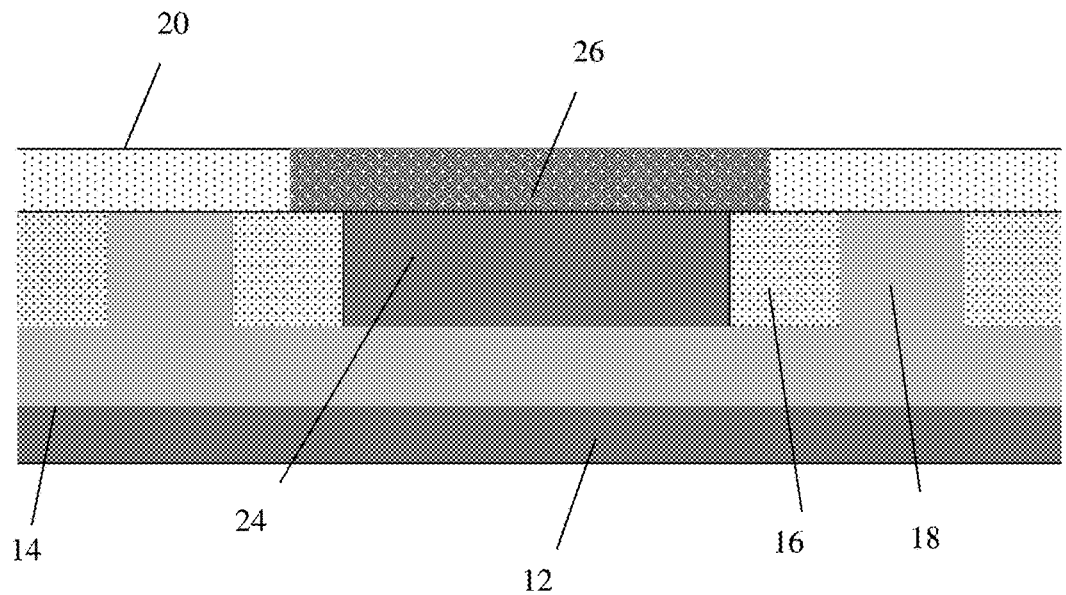
FIG. 3 shows an epitaxial material deposited on exposed semiconductor material in a collector region, amongst other features, and respective fabrication processes in accordance with aspects of the present disclosure.

FIG. 3 shows an epitaxial material 26 deposited on the exposed semiconductor material 12 in the collector region 24. In embodiments, the epitaxial material 26 above the collector region 24 will grow as a single crystalline semiconductor material, e.g., Si, SiC or SiGe, used to form part of the collector region 24 of the HBT. On the other hand, the epitaxial material 26 over the shallow trench isolations regions 16 will grow into poly material, as should be understood by those of skill in the art. The epitaxial material 26 can also be deposited on the surface of the material 20 which can be removed by a conventional planarization process, e.g., chemical mechanical polishing (CMP). The following description assumes that the epitaxial material 26 was either removed or was only selectively grown on the exposed semiconductor material 12 in the collector region 24; although, the material 26 can remain on the material 20 for removal in subsequent processes.

Figure 4:
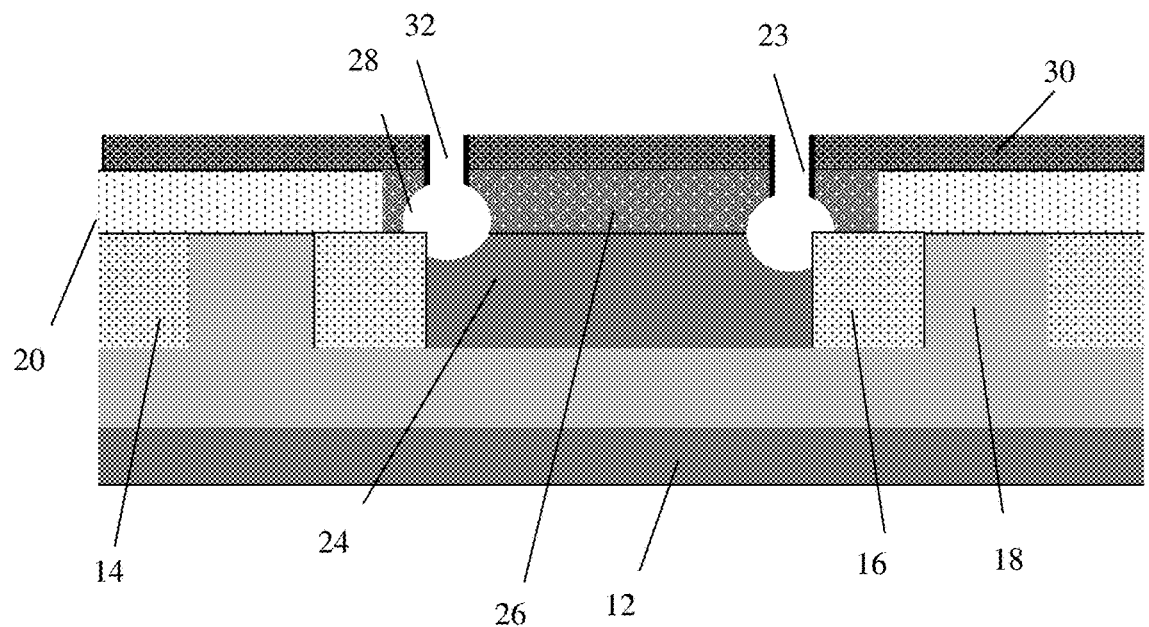
FIG. 4 shows cavity structures at a corner of the shallow trench isolation regions and within the collector region, amongst other features, and respective fabrication processes in accordance with aspects of the present disclosure.

FIG. 4 shows cavity structures 28 formed at a corner of the shallow trench isolation regions 16 and within the collector region 24. In embodiments, the cavity structures 28 extend into the epitaxial material 26 and the substrate 12, at the corner of the shallow trench isolation regions 16 and also could extend into the poly Si region layer 20 (adjacent to layer 26). Prior to forming of the cavity structures 28, a pad film 30 of nitride material or oxide material or combination of oxide and nitride is deposited onto the materials 20, 26 using conventional deposition processes, e.g., CVD. The nitride material can be deposited to a thickness of about 100 nm to 200 nm; whereas, the oxide material can be deposited to a thickness of about to 10 nm. It should be understood, though, that other thicknesses and combinations of materials are also contemplated herein.

To form the cavity structures 28, openings or trenches 32 are etched though the pad film 30 and into the material 26, exposing the substrate 12. In embodiments, the trenches 32 can extend into the substrate 12. In embodiments, the trenches 32 can also be "holes" and/or "bars" (forming a continuous airgap structure). In embodiments, holes would have 1:1 aspect ratio, while the bars would have aspect ratios >1:1. The trenches (holes and/or bars) 32 can be formed by conventional lithography and etching processes as already described herein such that no further explanation is required for a complete understanding of the present disclosure.

A sidewall liner 23 is formed on the sidewalls of the trenches 32 by depositing a dielectric material and anisotropic etching the dielectric material from the bottom and top planar features of the structure. The sidewall liner 23 should robustly coat the sidewalls of the trenches 32 in order to protect the underlying material from subsequent etching processes (for cavity formation). To achieve this robust sidewall coverage, the dielectric material or materials needs to be thick enough to leave a thick film on the sidewalls of the trenches 32 but not too thick that it pinches off the top opening of the trenches 32, which would prevent cavity formation during the successive cavity etch.

In embodiments, the sidewall liner 23 can be an oxide material, as an example, composed of a combination of a thermal oxidization of the substrate 12 in a furnace to form to form a $SiO_2$ layer, followed by a CVD, atomic layer deposition (ALD), or any other known oxide deposition method. In embodiments, the anisotropic etch could consist of a RIE using a perfluorocarbon-based chemistry, which etches material from planar surfaces but leaves dielectric material on the sidewall of the trenches 32.

Prior to the cavity structure formation, an optional vapor or liquid HF treatment, hydrogen plasma, anneal, basic or acidic chemical clean, or any process known to remove thin or native dielectrics or residual spacer etch polymer can be used to remove excessive dielectric at a bottom of the trenches 32 (e.g., from the exposed substrate 12 (e.g., silicon)). The post sidewall liner etch cleans (e.g., anisotropic etch) should still leave a robust dielectric sidewall liner 23 on the top corner and sidewall of the trenches 32 to prevent etching of the substrate 12 or material 26 through the sidewall of the trenches 32 during cavity formation.

As further shown in FIG. 4, the cavity structures 28 are selectively formed in the substrate 12 at a corner of the shallow trench isolation regions 16. The cavity structures 28 are formed by an etching process through the bottom of the trenches 32. During the etching process, the pad film 30 and the spacer films (e.g., sidewall liner) 23 protect the substrate 12 and the material 26 from being unintentionally etched during the cavity formation. In embodiments, the exposed substrate material 12 and, in embodiments, portions of the material 26, can be removed by a wet etching process or dry etching process. For example, dry etchants can include plasma-based $CF_4$, plasma-based $SF_6$, or gas $XeF_4$ silicon etch, etc., and wet etching processes can include KOH and $NH_4OH$. To avoid unintentional etching of the substrate 12 or the epitaxial material 26 on the sidewall of the trenches and top surface of the structure, the pad film 30 and sidewall liner 23 completely cover the substrate 12 and the epitaxial material 26.

Figure 5:
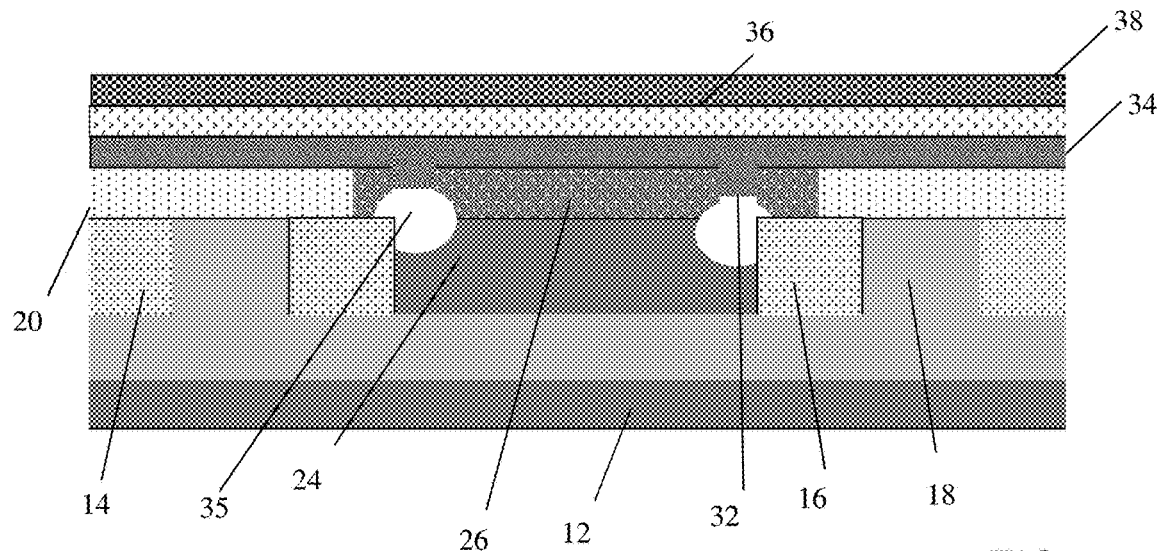
FIG. 5 shows sealed airgaps, amongst other features, and respective fabrication processes in accordance with aspects of the present disclosure.

In FIG. 5, the sidewall liner and pad film are removed, exposing the upper surface of the materials 20, 26 and the sidewalls of the trenches 32. In embodiments, the sidewall liner and pad film can be removed by a conventional etching process selective to such materials. For example, the sidewall liner and pad film can be removed by using only a combination of hot phosphorous followed by an HF chemistry or vice-versa depending on the single dielectric layer or stack of different dielectric layers used for sidewall liner.

Following the removal of the sidewall liner and pad film, the trenches 32 are subjected to an optional annealing process to soften or round (curve) the edges of the trenches. By way of one example, following an HF preclean process, the structure can undergo an annealing process at a temperature range of about 800° C. to about 1100° C., for up to about 60 seconds. In more specific embodiments, the annealing process can be at a temperature of about 650° C. for 60 seconds performed in an $H_2$ atmosphere; although other hydrogen atmospheres are also contemplated herein, e.g., $NH_3$, $B_2H_6$, Phi, $AsH_2$ or other gases bonded to hydrogen. In embodiments, the annealing in a $H_2$ or other hydrogen atmosphere may remove any native or other oxide from the silicon based surfaces and will smooth or reflow the walls of the cavity structures 28. If little or no curvature is used, then the annealing temperature, time, or hydrogen-based gas flow is reduced to eliminate or minimize the silicon substrate reflow.

Still referring to FIG. 5, an epitaxial material 34 is deposited (e.g., grown) on the material 20 and the epitaxial material 26. In embodiments, the material 34 is composed of SiGe used as the intrinsic (and/or extrinsic) base of the HBT. The SiGe material 34 can be deposited using ultra high vacuum CVD (UHVCVD), e.g., at a temperature of about 600° C. to 850° C., sealing the cavity structures 28 and thereby forming sealed airgaps 35. In an example, the SiGe material 34 can be heated to equal to or greater than the reflow temperature so that the SiGe material 34 fills in the top of trench 32. Since SiGe has a lower reflow temperature than Si, the SiGe material 34 can be reflowed into the opening of the trench 32 to plug or fill the top of the trench 32 without filling in the cavity structure 28, itself, and hence forming a sealed airgap 35. In embodiments, the reflow temperature is 800-1050° C. and the reflow time is anywhere up to about 600 seconds. In more specific embodiments, the reflow temperature is 850° C. and the reflow time is 60 seconds.

In this way, the sealed airgaps 35 are composed of the collector material, shallow trench isolation material and sealed with SiGe base material (i.e., that is, the sealed airgap 35 has a triple interface, i.e., the interface of the extrinsic base, corner of the shallow trench isolation and the collector region). Also, the sealed airgap 35 extends vertically through part of the collector region 24. Moreover, the sealed airgap 35 can extend vertically through the intrinsic base, e.g., material 34. As in any of the embodiments, the sealed airgap 35 can have a diameter of 0.1 µm; although other dimensions are contemplated herein.

FIG. 5 further shows additional intrinsic base material 36 deposited on the material 34 (once the cavity structure 28 is sealed). In embodiments, the additional base material 36 is doped SiGe material used as the intrinsic base. The dopants can be, e.g., C or B. An emitter material 38 is deposited on the additional base material 36. The emitter material 38 can be epitaxial grown Si or SiGe material, for example.

Figure 6:
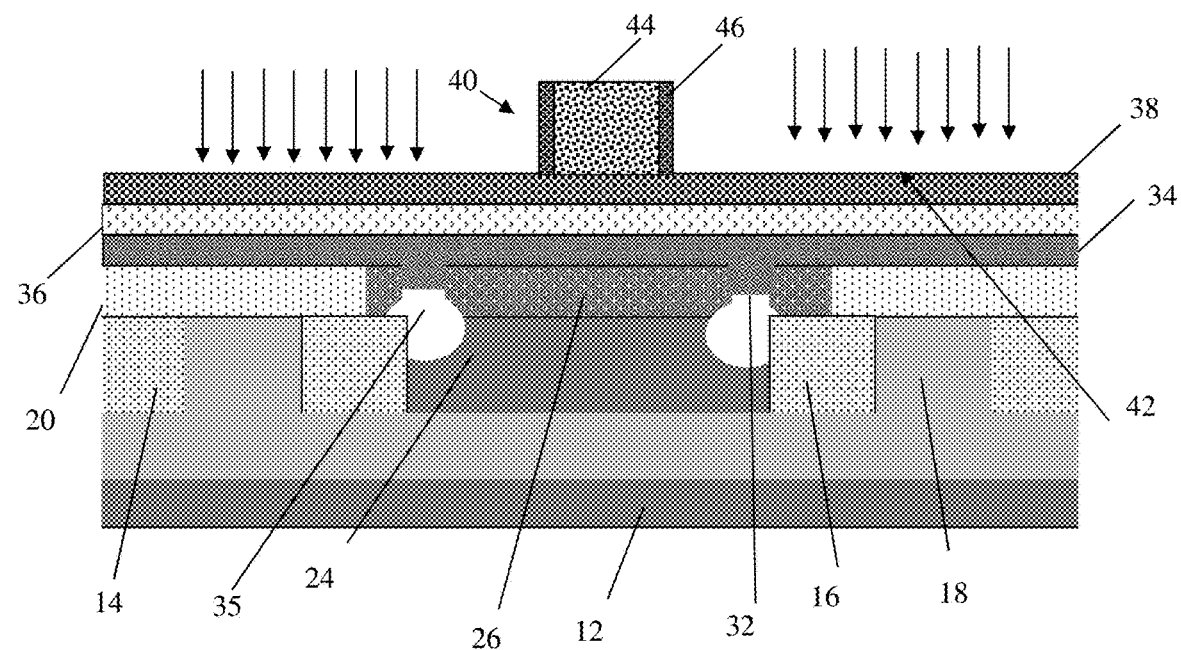
FIG. 6 shows an emitter region and extrinsic base region, amongst other features, and respective fabrication processes in accordance with aspects of the present disclosure.

FIG. 6 shows an emitter region 40 and extrinsic base region 42, amongst other features, and respective fabrication processes in accordance with aspects of the present disclosure. More specifically, the extrinsic/intrinsic base material 38 is subject to a doping process, e.g., ion implantation process, to form the extrinsic base region 42. In embodiments, the ion implantation process uses a p-type dopant to form a highly doped material as should be understood by those of skill in the art such that no further explanation is required for a complete understanding of the present disclosure.

Still referring to FIG. 6, the emitter region 40 is formed above the collector region 24, in direct contact with the intrinsic base (e.g., extrinsic/intrinsic base material 38). The emitter region 40 is composed of dielectric material and polysilicon material 46, with sidewalls 44. The sidewalls 44 can be a single sidewall material or multiple sidewall materials, e.g., oxide and/or nitrogen. The emitter region 40 is formed using conventional lithography, etching and deposition processes such that no further explanation is required herein for a complete understanding of the present disclosure.

Figure 7:
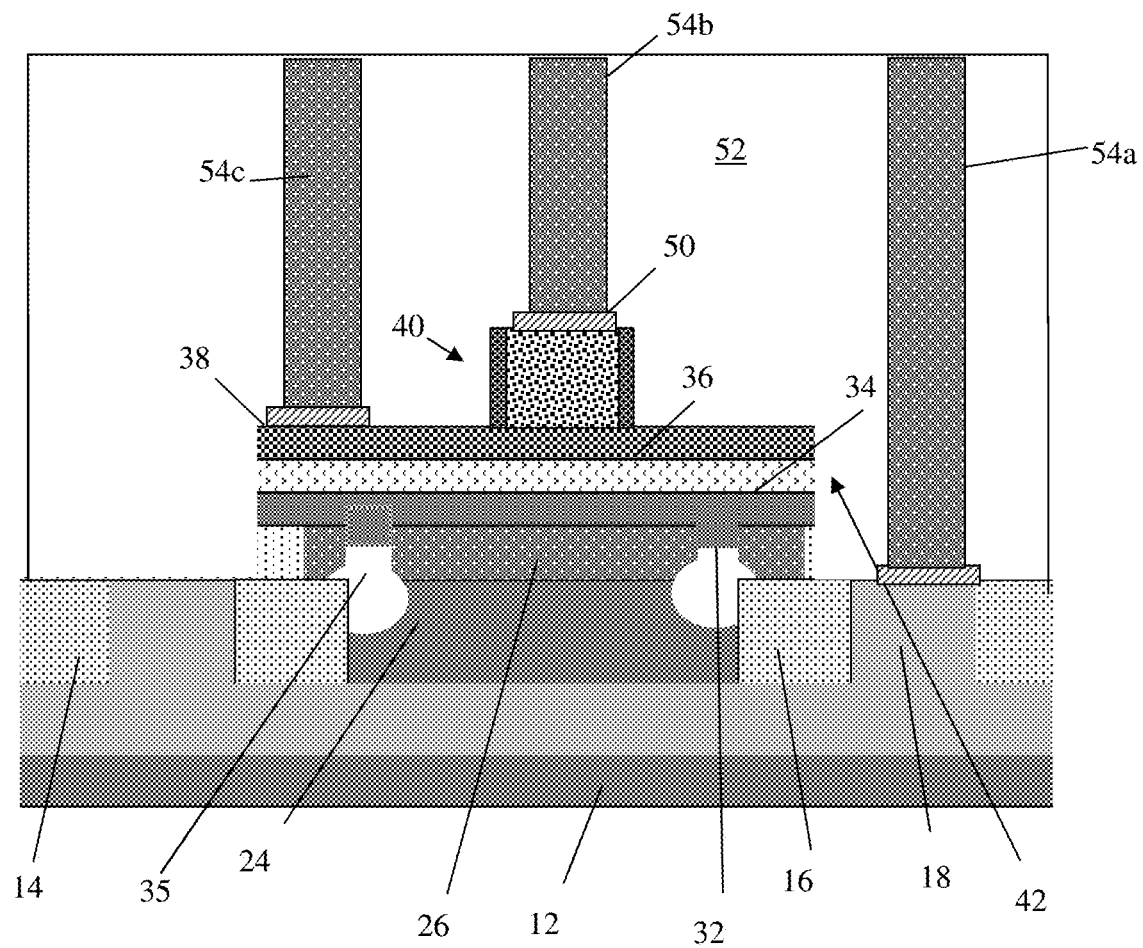
FIG. 7 shows contacts to the emitter region, extrinsic base region, and collector region, amongst other features, and respective fabrication processes in accordance with aspects of the present disclosure.

In FIG. 7, the materials 20, 34, 36, 38 are patterned using conventional lithography and etching processes to expose the subcollector region, e.g., diffusion regions 18 of the substrate 12, which electrically contacts to the subcollector region 14 and collector region 24. Prior to contact formation, silicide contacts 50 are formed in contact with the collector region 24, e.g., subcollector region 14, emitter region 40 and the extrinsic base 42. As should be understood by those of skill in the art, the silicide process begins with deposition of a thin transition metal layer, e.g., nickel, cobalt or titanium, over fully formed and patterned semiconductor materials. After deposition of the material, the structure is heated allowing the transition metal to react with exposed silicon (or other semiconductor material as described herein) forming a low-resistance transition metal silicide contacts 32. Following the reaction, any remaining transition metal is removed by chemical etching, leaving silicide contacts 32.

A dielectric material 52 is deposited over the structure, e.g., subcollector region 14, emitter region 40 and the extrinsic base region 42, followed by a lithography, etching and deposition processes (e.g., metallization process). For example, the dielectric material 52 is deposited by a CVD process, followed by the lithography and etching (e.g., RIE) process to form trenches with in the dielectric material 52. A metal material, e.g., aluminum or tungsten, is deposited within the trenches to form the contacts, e.g., collector contact 54a, emitter region contact 54b and extrinsic base contact 54c.

Figure 8:
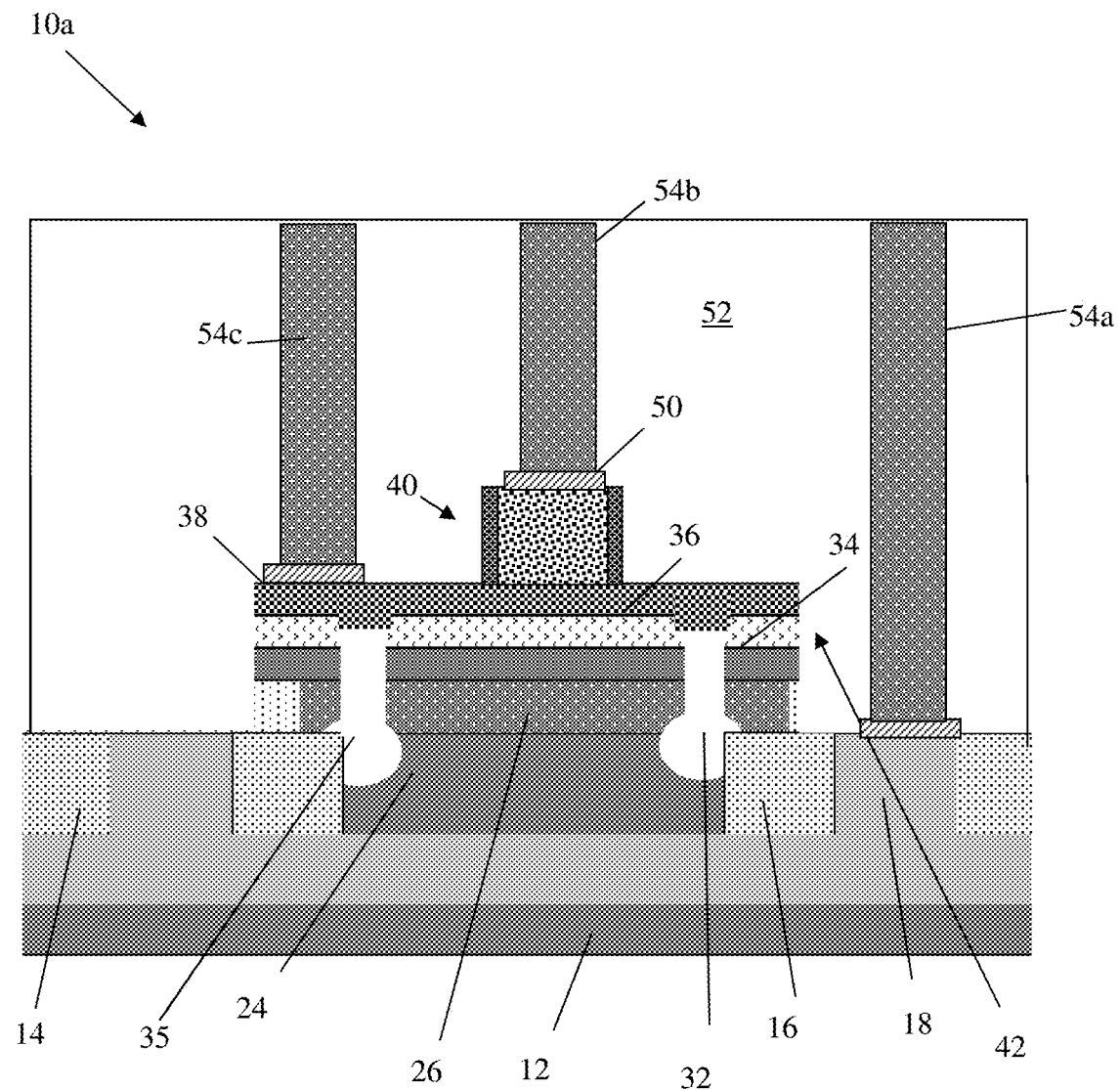
FIG. 8 shows a heterojunction bipolar transistor with airgaps sealed by emitter material and respective fabrication processes in accordance with alternative aspects of the present disclosure.

FIG. 8 shows a heterojunction bipolar transistor with an airgap sealed by emitter material in accordance with alternative aspects of the present disclosure. More specifically, in the heterojunction bipolar transistor 10a of FIG. 8, the trenches 32 are formed through the layers of material 26, 34 and 36. The trenches 32 are formed in a similar manner as described with respect to FIG. 4, with the addition of etching through the materials 34, 36 using selective chemistries for such materials. The cavity structures 28 are also formed within the substrate 12, in addition to the collector region material 26. The trenches 32 are then sealed with the epitaxial material 38 of the emitter material by conventional deposition processes as described herein. As in the previous embodiment, the sealed airgap 35 extends vertically through part of the collector region 24 and also extends vertically through the intrinsic base, e.g., material 34, 36. The remaining structure is similar to that described with respect to FIG. 7.

Figure 9:
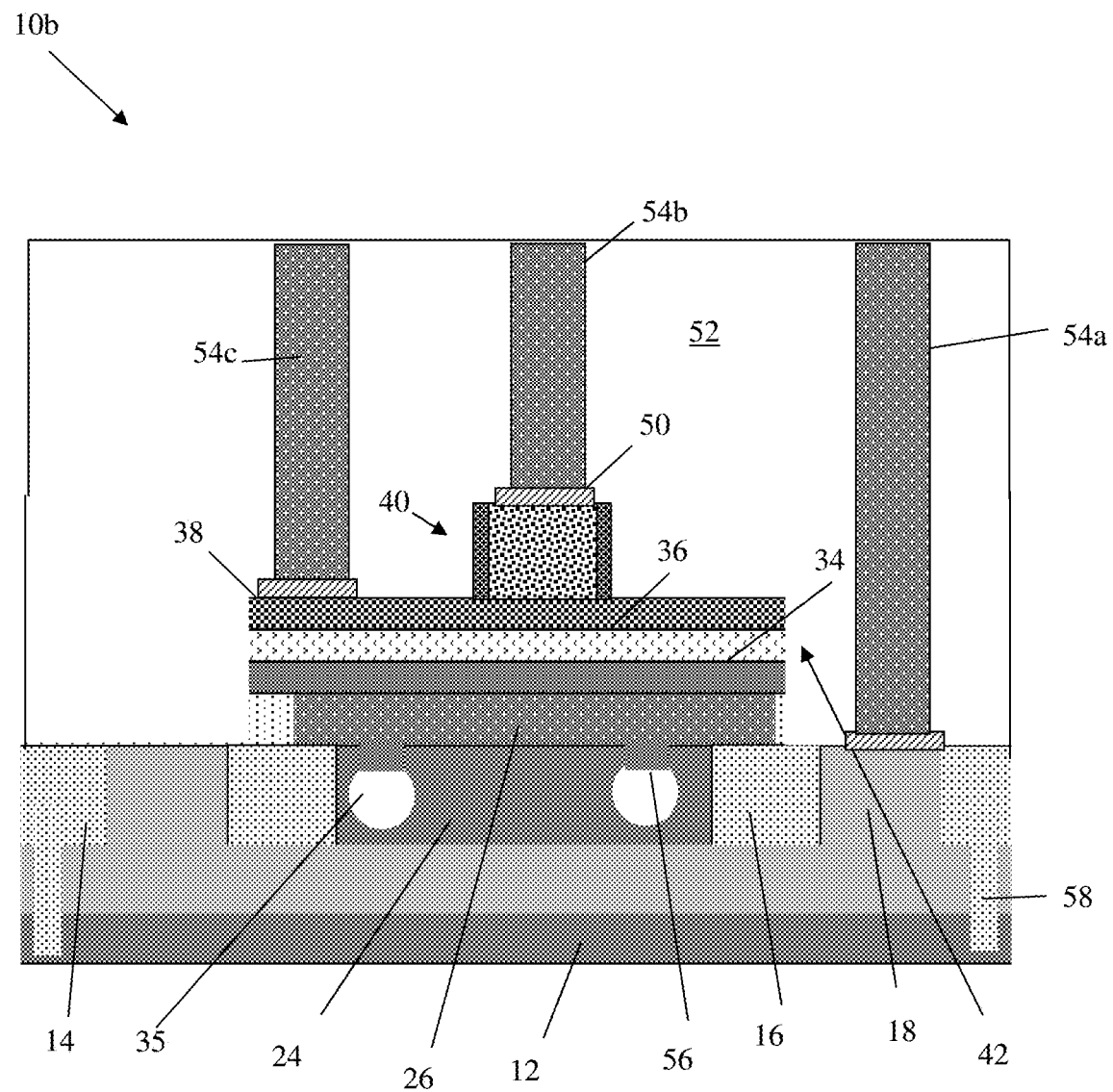
FIG. 9 shows a heterojunction bipolar transistor with airgaps sealed by epitaxial material and surrounded by collector material and respective fabrication processes in accordance with alternative aspects of the present disclosure.

FIG. 9 shows a heterojunction bipolar transistor with an airgap sealed by epitaxial material and surrounded by collector material in accordance with alternative aspects of the present disclosure. More specifically, in the heterojunction bipolar transistor 10b of FIG. 9, the cavity structures 28 are formed entirely within the substrate 12, i.e., collector region 24, prior to the formation of the shallow trench isolation regions 16.

In this embodiment, a trench and cavity are formed in the substrate 12, within the collector region 24. An epitaxial growth of material, i.e., SiGe, is used to seal the cavity structure to form the sealed airgap 35. The epitaxial growth of SiGe material can be provided by the processes described herein. Accordingly, in this embodiment, the airgap 35 is surrounded by collector material, i.e., Si, on all sides except for SiGe seal. After the SiGe grown, additional silicon can be grown, e.g., 0.8 µm, followed by the formation of the shallow trench isolation regions 16 and diffusions 18. As in any of the embodiments, an optional deep trench 58 can be provided to isolate the subcollector region 14. The remaining structure (and respective processes) is similar to that described with respect to FIG. 7.

Figure 10:
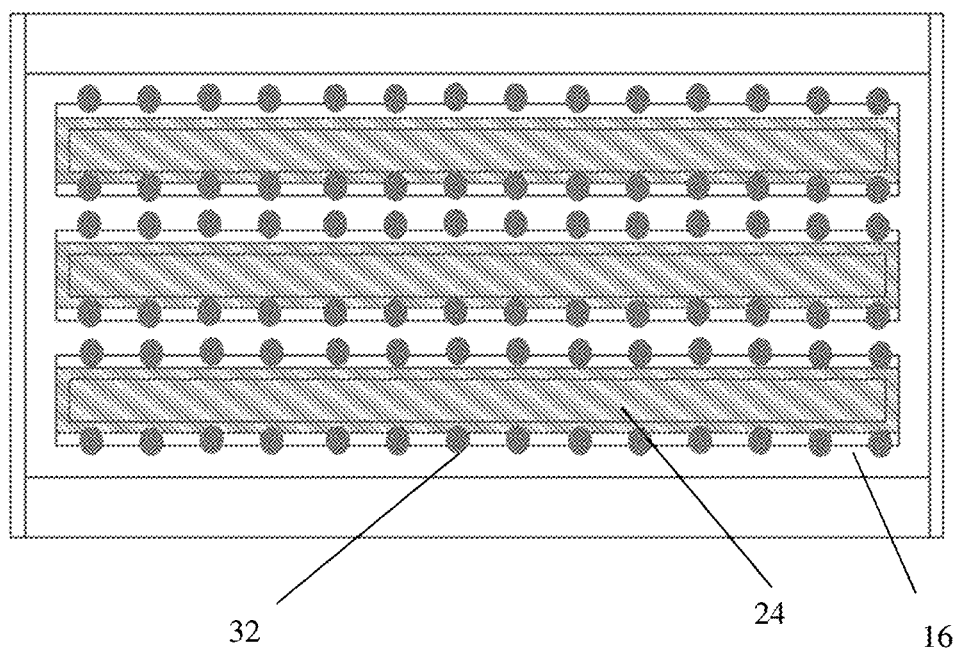
FIG. 10 shows a layout of trenches (holes) used for airgap formation and respective fabrication processes in accordance with alternative aspects of the present disclosure.

FIG. 10 shows a layout of trenches 32 used for airgap formation in accordance with aspects of the present disclosure. In embodiments, the trenches 32 are formed along a length of the collector region 24, at a corner of shallow trench isolation regions 16. In embodiments, the trenches 32 can be in parallel rows along the emitter region with the distance between the trenches 32 adjusted so that the "undercut" of the sealed airgap merges together to form a single (continuous) sealed airgap for lower Ccb. The trenches can be representative of holes with a dimension of about 0.1 $\mu m^2 \times 0.1 \ \mu m^2$; although other dimensions are contemplated herein. In alternative embodiments, the trenches 32 can be representative of a bar with a dimension of about 0.1 um× the size of the emitter length, as an example.

The transistors can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a subcollector region in a substrate;
   a collector region above the substrate;
   a sealed airgap formed at least partly in the collector region, the sealed airgap being sealed by semiconductor material;
   a base region adjacent to the collector region; and
   an emitter region adjacent to the base region.

2. The structure of claim 1, wherein a base material of the base region seals the sealed airgap.

3. The structure of claim 2, wherein the base material is SiGe.

4. The structure of claim 2, wherein the sealed airgap includes a trench extending into collector material of the collector region composed of crystalline Si and poly Si, and which is sealed by the base material.

5. The structure of claim 1, wherein emitter material of the emitter region seals the sealed airgap.

6. The structure of claim 5, wherein the emitter material is SiGe.

7. The structure of claim 5, wherein the sealed airgap includes a trench which extends into collector material, base material and which is sealed by the emitter material.

8. The structure of claim 1, wherein the sealed airgap extends vertically through part of the collector region at a corner of shallow isolation regions.

9. The structure of claim 1, wherein the sealed airgap extends vertically through an intrinsic base region and the collector region.

10. The structure of claim 1, wherein the sealed airgap is continuous along a length of emitter region.

11. The structure of claim 1, wherein the sealed airgap includes isolated holes.

12. The structure of claim 1, wherein the sealed airgap is surrounded by collector material of the collector region and sealed by SiGe.

13. The structure of claim 1, wherein the sealed airgap include trenches which are sealed by either emitter material or intrinsic base material.

14. A structure comprising:
a bipolar device comprising an emitter, base, collector and subcollector;
shallow trench isolation regions isolating the collector; and
at least one sealed airgap at least partly within the collector and at a corner of the shallow trench isolation regions,
wherein the at least one sealed airgap include trenches which are sealed by either emitter material or intrinsic base material.

15. The structure of claim 14, wherein the at least one sealed airgap is provided within the collector and is surrounded by collector material and sealed with epitaxial material.

16. The structure of claim 15, wherein the epitaxial material is SiGe.

17. The structure of claim 14, wherein the at least one sealed airgap is a plurality of sealed airgaps running parallel along the emitter.

18. The structure of claim 14, wherein the airgaps are sealed with epitaxial material.

19. The structure of claim 18, wherein the epitaxial material is reflowed SiGe.

20. A method comprising:
forming a subcollector region in a substrate;
forming a collector region above the substrate;
forming a sealed airgap formed at least partly in the collector region by sealing a trench extending in the collector region with semiconductor material;
forming a base region adjacent to the collector region; and
forming an emitter region adjacent to the base region.

* * * * *